US012681087B2

(12) United States Patent
Lu et al.

(10) Patent No.: US 12,681,087 B2
(45) Date of Patent: Jul. 14, 2026

(54) SAMPLING APPARATUS, BATTERY MANAGEMENT SYSTEM, AND VEHICLE

(71) Applicant: BYD COMPANY LIMITED, Shenzhen (CN)

(72) Inventors: Zhipei Lu, Shenzhen (CN); Linwang Deng, Shenzhen (CN); Chengzhi Wang, Shenzhen (CN); Zeru Tang, Shenzhen (CN); Yantao Liu, Shenzhen (CN); Bojun Xiong, Shenzhen (CN); Xianyong Wu, Shenzhen (CN); Congji E, Shenzhen (CN)

(73) Assignee: BYD COMPANY LIMITED, Shenzhen (CN)

( * ) Notice: Subject to any disclaimer, the term of this patent is extended or adjusted under 35 U.S.C. 154(b) by 148 days.

(21) Appl. No.: 18/639,461

(22) Filed: Apr. 18, 2024

(65) Prior Publication Data

US 2024/0264233 A1 Aug. 8, 2024

Related U.S. Application Data

(63) Continuation of application No. PCT/CN2022/124373, filed on Oct. 10, 2022.

(30) Foreign Application Priority Data

Oct. 29, 2021 (CN) .......................... 202122641107.2
Feb. 18, 2022 (CN) .......................... 202220343039.3

(51) Int. Cl.
*G01R 31/364* (2019.01)
*B60R 16/023* (2006.01)
*H01M 10/42* (2006.01)

(52) U.S. Cl.
CPC .......... *G01R 31/364* (2019.01); *B60R 16/023* (2013.01); *H01M 10/425* (2013.01); *H01M 2010/4271* (2013.01); *H01M 2220/20* (2013.01)

(58) Field of Classification Search
CPC .. G01R 31/364; B60R 16/023; H01M 10/425; H01M 2010/4271; H01M 2220/20
(Continued)

(56) References Cited

U.S. PATENT DOCUMENTS

2002/0182480 A1* 12/2002 Hanauer ............. H01M 50/209
429/62
2015/0104683 A1 4/2015 Lundström et al.
(Continued)

FOREIGN PATENT DOCUMENTS

CN 109039136 A 12/2018
CN 211417022 U 9/2020
(Continued)

OTHER PUBLICATIONS

The World Intellectual Property Organization (WIPO) International Search Report for PCT/CN2022/124373 Jan. 9, 2023 5 Pages (including translation).

*Primary Examiner* — Richard Isla
*Assistant Examiner* — Trung Q Nguyen
(74) *Attorney, Agent, or Firm* — Wenye Tan

(57) ABSTRACT

The present disclosure relates to the technical field of batteries, and provides a sampling device, a battery management system, and a vehicle. The sampling device includes multiple core function regions, an auxiliary function region, and a terminal connector. The multiple core function regions are configured to process information of a battery. The auxiliary function region has wiring arranged therein, and is configured to transmit a signal corresponding
(Continued)

to the information. The multiple core function regions are cascaded through the wiring.

17 Claims, 8 Drawing Sheets

(58) Field of Classification Search
USPC ..................... 324/500, 600, 76.11, 413–435
See application file for complete search history.

(56) References Cited

U.S. PATENT DOCUMENTS

| | | | |
|---|---|---|---|
| 2017/0190257 A1* | 7/2017 | Chuang ................. | H02J 7/0047 |
| 2017/0267119 A1 | 9/2017 | Park et al. | |
| 2021/0028502 A1 | 1/2021 | Seol | |
| 2022/0368149 A1* | 11/2022 | Katagiri .............. | H02M 1/0032 |
| 2022/0407161 A1* | 12/2022 | Li ........................ | H01M 50/533 |
| 2023/0207902 A1* | 6/2023 | Fosler ................. | H01M 10/425 |
| | | | 429/90 |
| 2024/0014517 A1* | 1/2024 | Ikeda .................. | H01M 50/572 |
| 2024/0088813 A1* | 3/2024 | Nishimura .............. | H02P 27/06 |

FOREIGN PATENT DOCUMENTS

| | | | |
|---|---|---|---|
| EP | 2523246 A1 | 11/2012 | |
| WO | 2010074290 A1 | 7/2010 | |
| WO | 2014184920 A1 | 11/2014 | |

* cited by examiner

SAMPLING APPARATUS, BATTERY MANAGEMENT SYSTEM, AND VEHICLE

CROSS-REFERENCE TO RELATED APPLICATIONS

The present application is a continuation application of PCT application No. PCT/CN2022/124373, filed on Oct. 10, 2022, which claims priority to Chinese Patent Application No. 2021226411072, filed on Oct. 29, 2021 and entitled "SAMPLING DEVICE, BATTERY INFORMATION COLLECTOR, BATTERY MANAGEMENT SYSTEM, AND VEHICLE" and to Chinese Patent Application No. 202220343039.3, filed on Feb. 18, 2022 and entitled "SAMPLING DEVICE, BATTERY MANAGEMENT SYSTEM, BATTERY PACK, AND VEHICLE". The entire content of all of the above-referenced applications is incorporated herein by reference.

FIELD

The present disclosure relates to the technical field of batteries, and more specifically, to a sampling device, a battery management system, and a vehicle.

BACKGROUND

At present, new energy vehicles become the frontier science of current automotive technology development, and electric vehicles gradually become an important direction that replaces conventional fuel vehicles. A battery module functions as a "heart" of the electric vehicles, and management of the battery module is realized through a battery management system. A collection module is an important component of the battery management system, which is configured to collect information such as a single voltage, a total voltage, a current, and a temperature. Reliability of a collector is of great significance.

In many existing battery modules, information such as a voltage, a current, and a temperature is collected by using a wire harness. Using the wire harness to connect the collector to the battery module results in a larger number of connection links, which increases an impedance and a probability of failure. In addition, since the wire harness needs to be connected to a printed circuit board (PCB) by using a connector, risks caused by poor soldering between the connector and the PCB, breakage of the wire harness, and the like also exist.

Although an idea of using a flexible flat cable (FFC) instead of the wire harness to realize connection with the battery module is proposed, for the PCB, especially cascade of multiple PCBs, the wire harness and the connector are still used. However, the risks caused by poor soldering between the connector and the PCB, breakage of the wire harness, and the like still exist. In addition, since the connector exists, a physical area of the PCB cannot be reduced, which indirectly increases costs and a volume of the collection module.

SUMMARY

In view of the foregoing problems, the present disclosure provides a sampling device, a battery management system, a battery pack, and a vehicle, to resolve or partially resolve the foregoing problems.

According to a first aspect, a sampling device is provided. The sampling device includes multiple core function regions, an auxiliary function region, and a terminal connector. The multiple core function regions are configured to process information of a battery. The auxiliary function region has wiring arranged therein, and is configured to transmit a signal corresponding to the battery information. The multiple core function regions are cascaded through the wiring. The terminal connector is configured to connect the battery and the auxiliary function region to collect the battery information.

According to a second aspect, a battery management system is provided. The battery management system includes a battery management controller and the sampling device in any implementation of the first aspect. A connecting insert is arranged on the sampling device. The sampling device is electrically connected to the battery management controller through the connecting insert.

According to a third aspect, a battery pack is provided, which includes the sampling device in any implementation of the first aspect.

According to a fourth aspect, a vehicle is provided. The vehicle includes the sampling device in any implementation of the first aspect.

The embodiments of the present disclosure have the following advantages.

In the present disclosure, the multiple core function regions are configured to process information of the battery, the auxiliary function region has the wiring arranged therein, and is configured to transmit the signal corresponding to the information, the multiple core function regions are cascaded through the wiring of the auxiliary function region, and the terminal connector is configured to connect the battery and the auxiliary function region. In this way, the multiple core function regions can sample and obtain the information and parameters of the battery through the auxiliary function region and the terminal connector. Since a conventional wire harness is replaced with the auxiliary function region, problems that an impedance of the sampling device increases and a probability of failure increases caused by a large number of wire harness connection links do not exist.

The multiple core function regions are directly cascaded by using the wiring of the auxiliary function region, which replaces a current solution of realizing cascading by using a wire harness and a connector, thereby avoiding risks caused by poor soldering between the connector and the PCB, breakage of the wire harness, and the like still exist. In addition, since no connector exists, a physical area of the PCB can be reduced, which indirectly reduces costs and a volume of the collection device, and has high practicality.

BRIEF DESCRIPTION OF THE DRAWINGS

Various other advantages and benefits become clear to a person of ordinary skill in the art by reading the following detailed description of certain implementations. The drawings are merely used for showing certain embodiments, and cannot be construed as any limitation on the present disclosure. Throughout the drawings, same reference numerals are used to represent same components. In the drawings.

3

Figure 3:
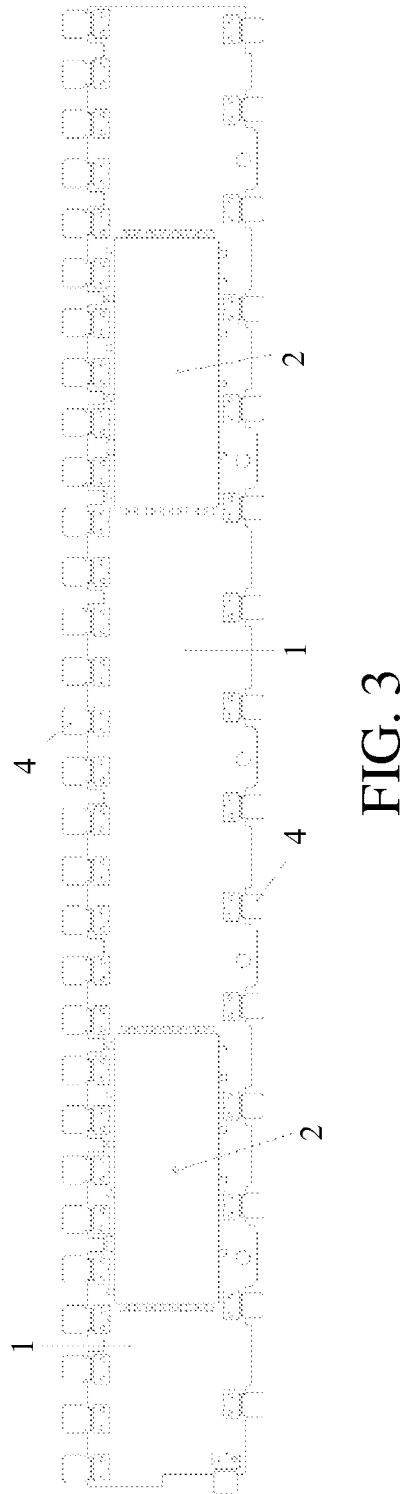

FIG. 3 is a schematic structural diagram in which two core function regions 2 and an auxiliary function region 1 are printed circuit boards (PCBs) according to an embodiment of the present disclosure.

Figure 4:
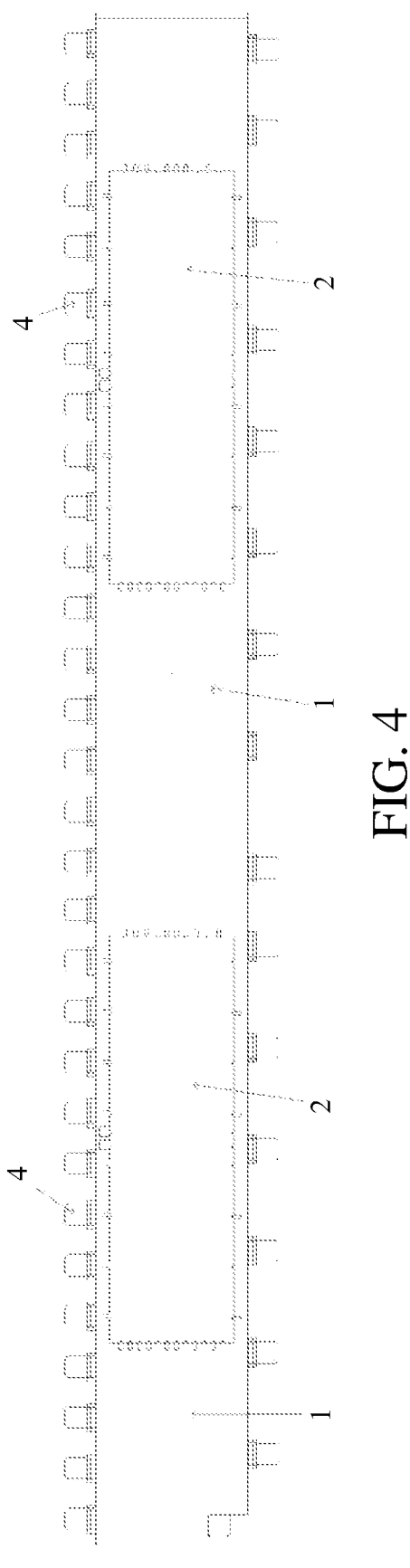

FIG. 4 is a schematic diagram in which two core function regions 2 and an auxiliary function region 1 are independently arranged according to an embodiment of the present disclosure.

Figure 5:
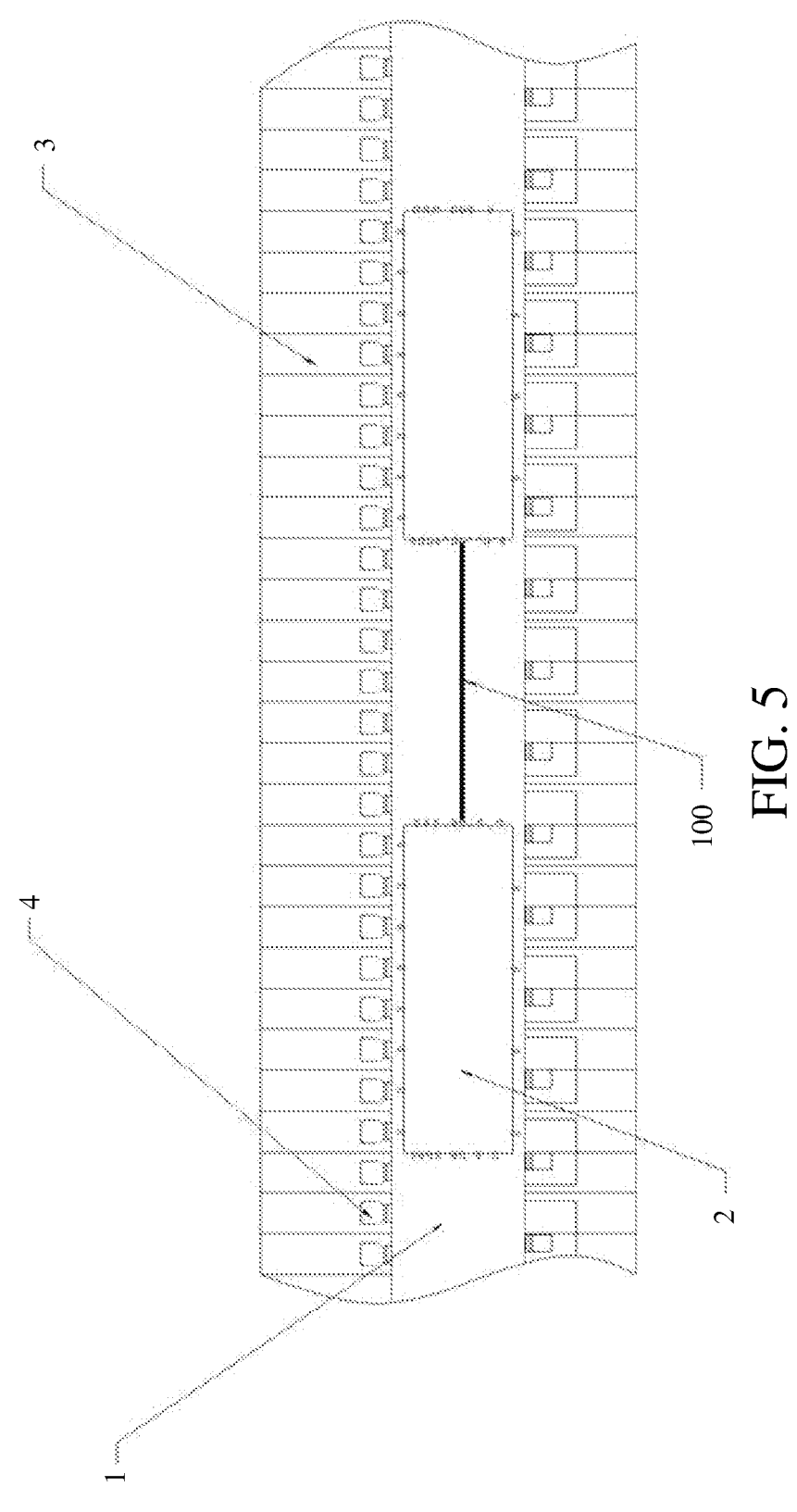

FIG. 5 is a partial schematic structural diagram of a sampling device in which an auxiliary function region adopts, for example, a flexible printed circuit (FPC) board and a core function region adopts, for example, a PCB according to an embodiment of the present disclosure.

Figure 6:
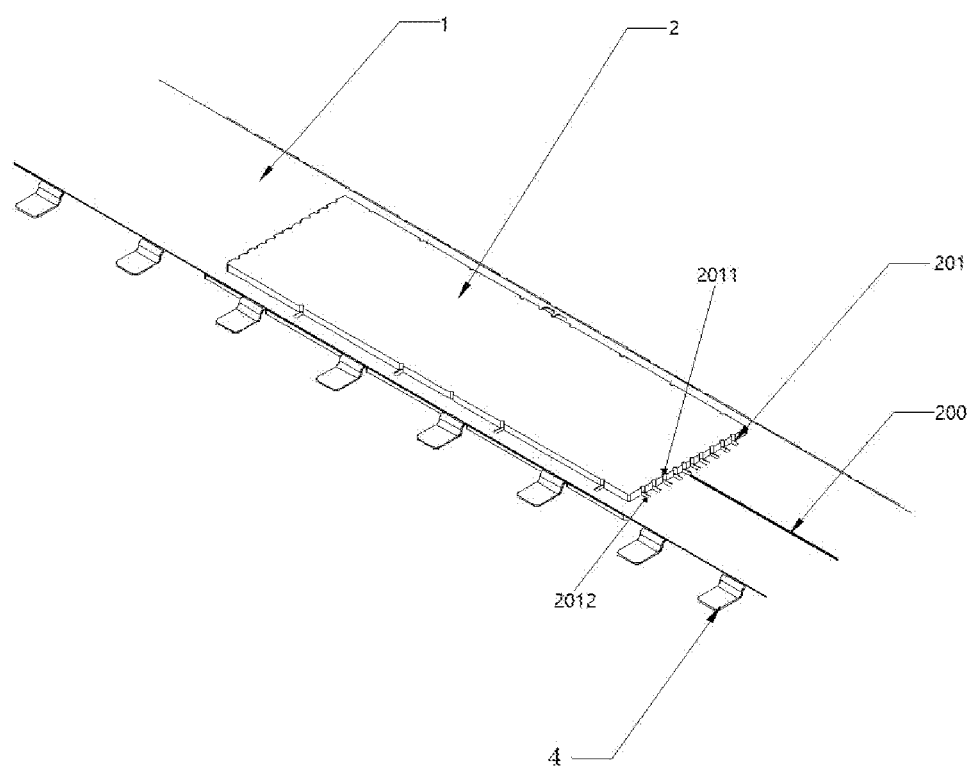

FIG. 6 is a schematic diagram of connection between a single PCB and an FPC board according to an embodiment of the present disclosure.

Figure 7:
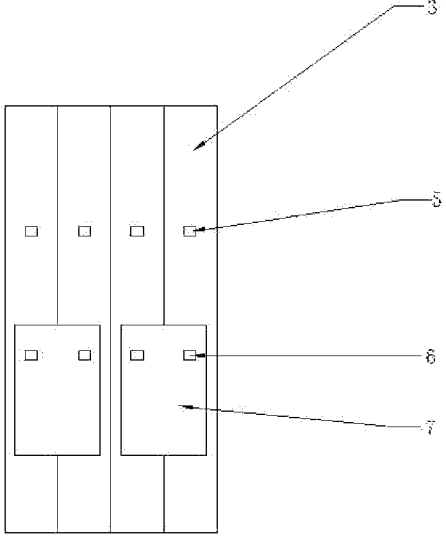

FIG. 7 is a schematic structural diagram of a battery and a pole structure thereof according to an embodiment of the present disclosure.

Figure 8:
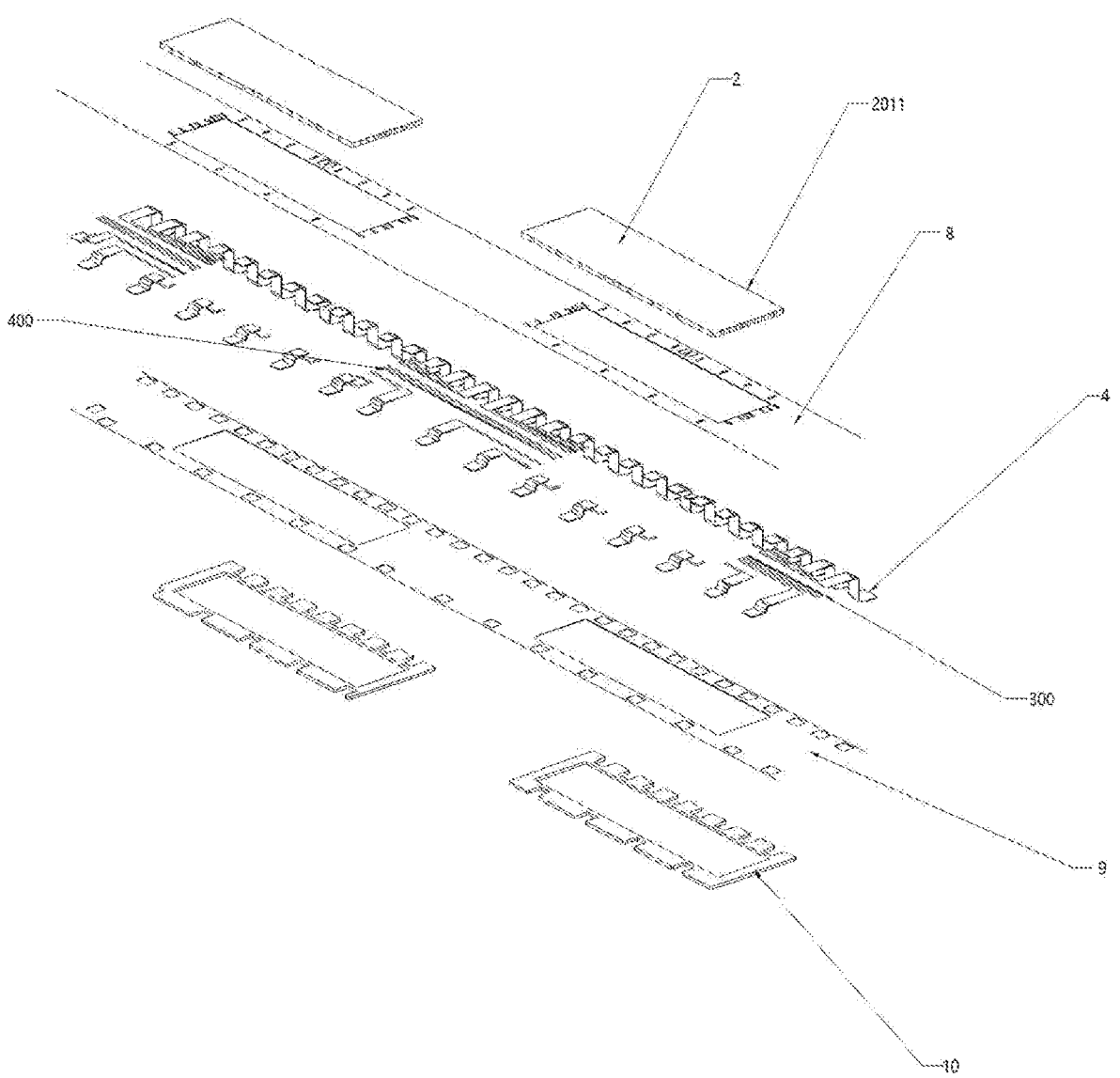

FIG. 8 is an exploded view of a sampling device formed by two PCBs and an FPC board according to an embodiment of the present disclosure.

Figure 9:
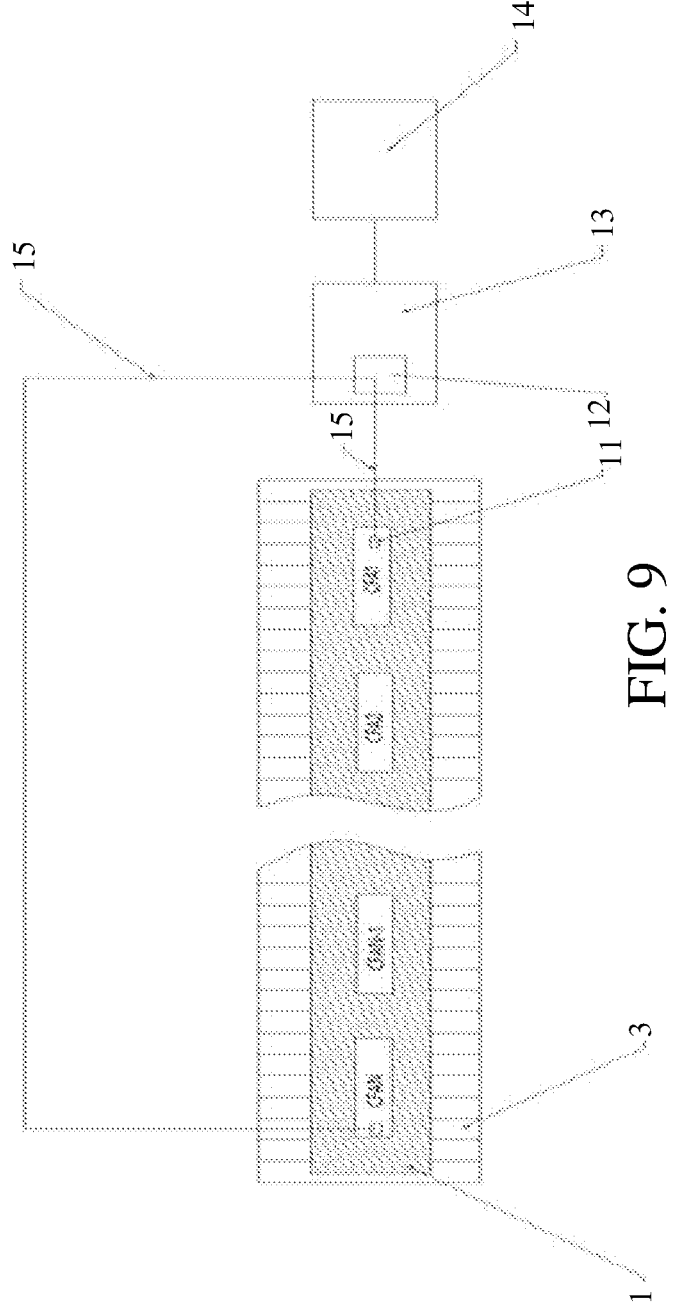

FIG. 9 is a schematic structural diagram of a battery management system according to an embodiment of the present disclosure.

DETAILED DESCRIPTION

To make the foregoing objectives, features, and advantages of the present disclosure clearer and easier to understand, the present disclosure is described in further detail below with reference to drawings. It should be understood that the specific embodiments described herein are merely used for explaining the present disclosure, and are only some rather than all of the embodiments of the present disclosure, and are not used for limiting the present disclosure.

An embodiment of the present disclosure provides a sampling device. The sampling device includes multiple core function regions, an auxiliary function region, and a terminal connector. The multiple core function regions are configured to process information of a battery. The auxiliary function region has wiring arranged therein, and is configured to transmit a signal corresponding to the information. The terminal connector is configured to connect the battery and the auxiliary function region, so that the multiple core function regions can obtain the information and parameters of the battery through the auxiliary function region and the terminal connector, and then process the information of the battery to equalize the battery. In addition, the multiple core function regions are cascaded by using the wiring of the auxiliary function region, which implements cascading between the multiple core function regions without using a wire harness and a connector currently used.

Figure 1:
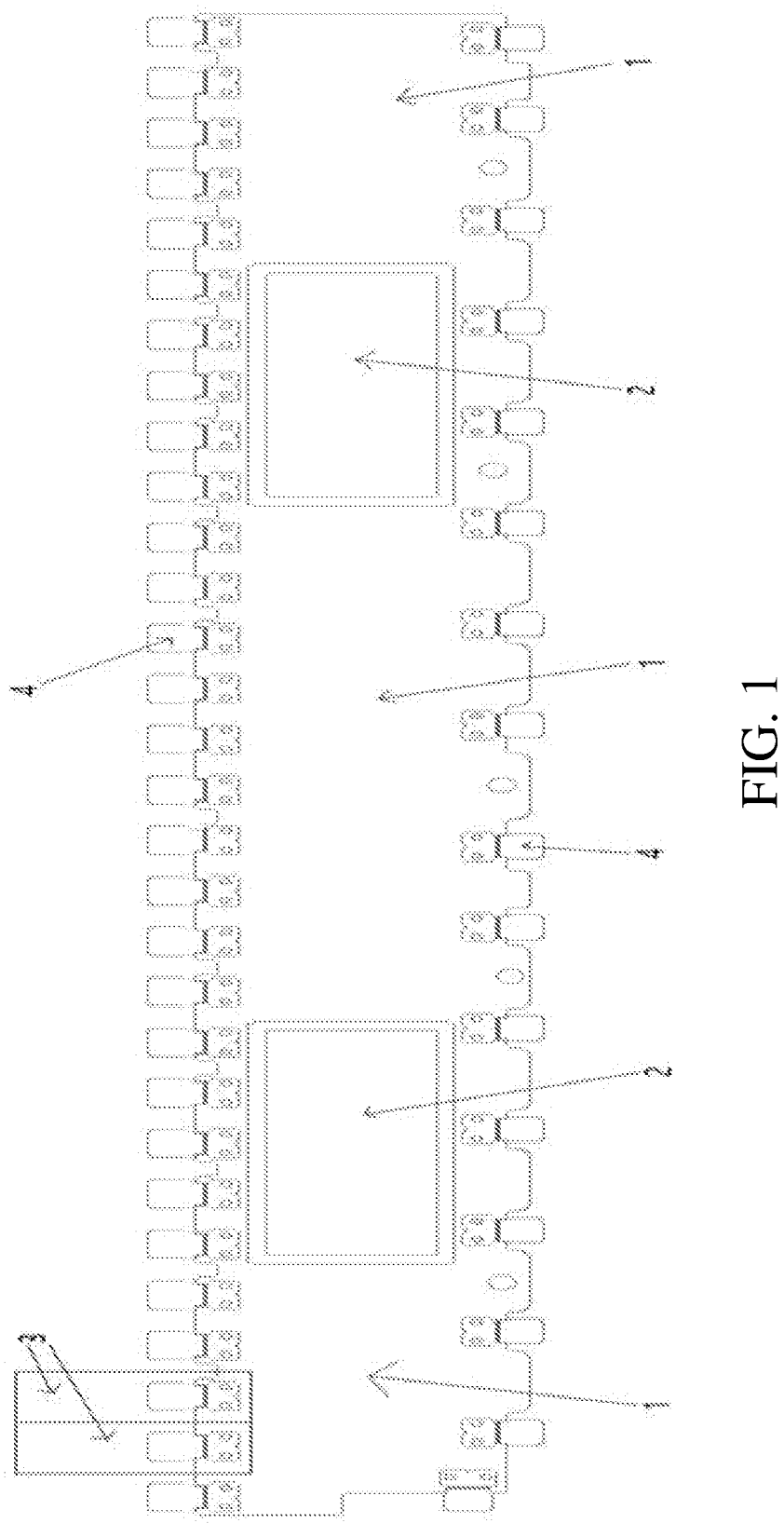
FIG. 1 is a schematic structural diagram of a sampling device according to an embodiment of the present disclosure.

FIG. 1 is a schematic structural diagram of a sampling device according to an embodiment of the present disclosure. The sampling device includes an auxiliary function region 1, two core function regions 2, and a terminal connector 4. The sampling device is connected to a battery 3 through the terminal connector 4. Two core function regions 2 are arranged in the auxiliary function region 1. The two core function regions 2 are cascaded through wiring of the auxiliary function region 1. It should be noted that only two batteries 3 are exemplarily shown in FIG. 1. In a practical application, a battery module includes multiple batteries, and each battery 3 is connected to the sampling device by using the terminal connector 4.

The auxiliary function region 1 has a lead-out terminal. The terminal connector 4 is electrically connected to the lead-out terminal of the auxiliary function region 1, or the lead-out terminal of the auxiliary function region 1 is the terminal connector 4. Preferably, the terminal connector 4 is made of a metal material.

In one embodiment of the present disclosure, the multiple core function regions 2 and the auxiliary function region 1 may be integrally arranged. In this arrangement, the multiple core function regions 2 are integrated in the auxiliary function region 1. Alternatively, the multiple core function regions 2 and the auxiliary function region 1 may be independently arranged. In this arrangement, the multiple core function regions 2 are arranged on the auxiliary function region 1.

For the integral arrangement, the core function regions 2 and the auxiliary function region 1 are flexible printed circuit (FPC) boards or printed circuit boards (PCBs). Specifically, the following three cases exist.

1). The auxiliary function region 1 adopts the FPC board, and components of each of the multiple core function regions 2 use the FPC board as a carrier board. In other words, the multiple core function regions 2 and the auxiliary function region 1 are manufactured by using the same FPC board.

2). The auxiliary function region 1 adopts the PCB, and each of the core function regions 2 adopts the PCB. In other words, the multiple core function regions 2 and the auxiliary function region 1 are manufactured by using the PCB. Similar to the manner 1), a large PCB is used as the auxiliary function region 1, and the components of each core function region use the PCB as a carrier board. Alternatively, a large single-layer PCB is used as the auxiliary function region 1, and a small PCB is separately manufactured on each core function region, and then is soldered to the large single-layer PCB. Certainly, the latter process is slightly more complex than the former process, but has a cost advantage.

3). The auxiliary function region 1 adopts the FPC board, and each of the core function regions 2 adopts the PCB. Since the FPC board needs to be wrapped with a cover film, after each core function region is soldered to the FPC board, the PCB is wrapped by using the cover film, so that the multiple core function regions 2 and the auxiliary function regions 1 are integrally arranged.

Figure 2:
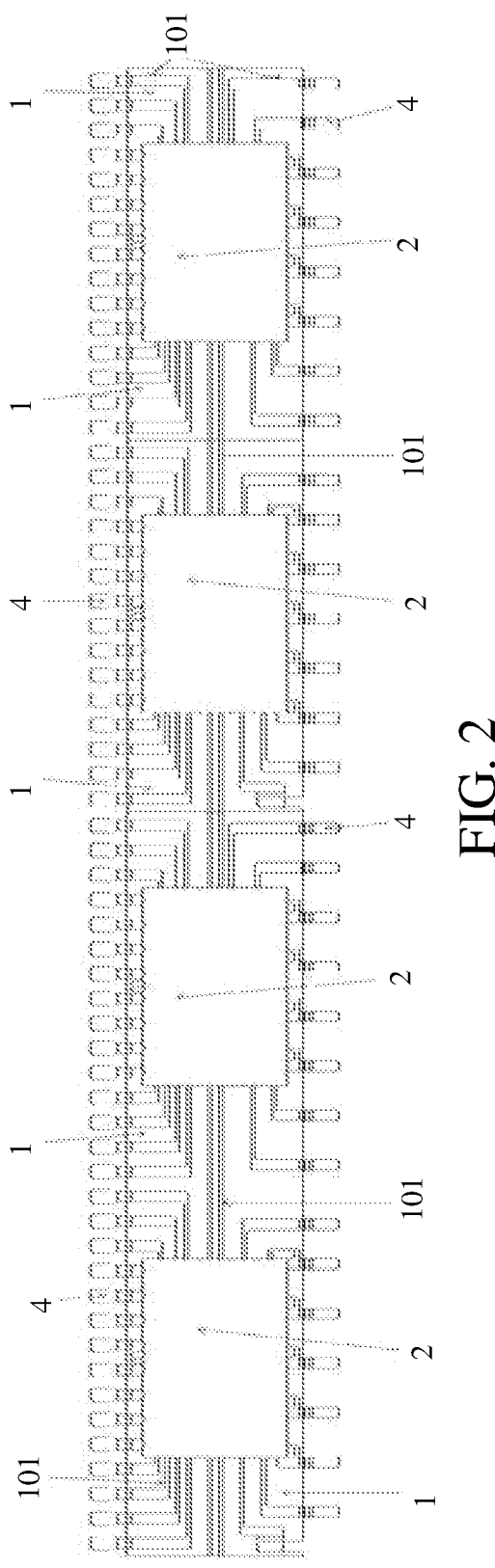
FIG. 2 is a schematic structural diagram in which four core function regions 2 and an auxiliary function region 1 are integrally arranged according to an embodiment of the present disclosure.

FIG. 2 is an exemplary schematic structural diagram in which four core function regions 2 and an auxiliary function region 1 are integrally arranged according to an embodiment of the present disclosure. In FIG. 2, the components (not shown in FIG. 2) of each core function region 2 use the FPC board as a carrier board, the auxiliary function region 1 also adopts the FPC board, and the terminal connector 4 is connected to the battery by using a lead-out portion of the FPC board. In this arrangement, the terminal connector 4 is substantially included in the auxiliary function region 1. Since the components of each core function region 2 use the FPC board as the carrier board, and cascade between the core function regions 2 is implemented by a flexible circuit 101, the multiple core function regions 2 can be integrally formed with the auxiliary function region 1 and the terminal connector 4.

In addition, it should be noted that a nickel piece may be further soldered at a joint of the FPC board and the battery 3. The FPC board is connected to the battery 3 by using the nickel piece as the terminal connector 4.

FIG. 3 is an exemplary schematic structural diagram in which two core function regions 2 and an auxiliary function region 1 are PCBs according to an embodiment of the present disclosure. In FIG. 3, each core function region 2 adopts the PCB. In addition, the auxiliary function region 1 adopts a single-layer PCB, and the terminal connector 4 is connected to the battery by using a nickel piece of the PCB. Although this structure does not replace an existing conventional connection manner of nickel piece soldering for a battery end, an internal circuit of the single-layer PCB replaces the conventional wire harness, which overall replaces the current solution of realizing cascading by using a wire harness and a connector. Compared with the current cascading solution, costs and a space of the wire harness and the connector are reduced, which can reduce a physical area of the PCB, thereby indirectly reducing costs and a volume of a collection device. In addition, this structure has lower costs than the foregoing structure that uses the FPC board. However, compared with the structure that uses the FPC board, this structure occupies a larger space and has a specific requirement on a space shape.

In one embodiment of the present disclosure, if the auxiliary function region 1 adopts the FPC board, the wiring is a flexible circuit of the FPC board, and the multiple core function regions 2 are cascaded by using the flexible circuit. If the auxiliary function region 1 adopts the PCB, the wiring is an internal circuit of the PCB, and the multiple core function regions 2 are cascaded by using the internal circuit.

The lead-out portion of the flexible circuit inside the FPC board may include a copper foil, an aluminum foil, a copper nickel strip, an aluminum nickel strip, or a nickel strip. If the auxiliary function region adopts the PCB, the terminal connector is configured to connect to the battery by using the nickel piece of the PCB. The flexible circuit includes a flexible etched circuit (FEC) or a flexible die-cutting circuit (FDC).

For the independent arrangement, the multiple core function regions 2 are arranged on the auxiliary function region 1. The core function regions 2 are FPC boards, and the auxiliary function region 1 is a PCB. Alternatively, the core function regions 2 are PCBs, and the auxiliary function region is an FPC board.

In the independent arrangement, a position on the auxiliary function region 1 corresponding to each core function region 2 is hollowed out; and the core function region 2 is arranged at the hollowed-out position and is electrically connected to the auxiliary function region. Arranging the hollowed-out position in the auxiliary function region 1 can further reduce manufacturing costs of the sampling device. In addition, since the core function region 2 is arranged at the hollowed-out position, a heat dissipation effect of the components in the core function region 2 is further improved, thereby improving efficiency of the components in the core function region 2. Further, since the core function region 2 needs to be arranged on the auxiliary function region 1, an area of the hollowed-out position needs to be less than an area of the core function region 2, to realize stable and firm connection of the core function region 2. It may be understood that, in another embodiment of the present disclosure, the core function region 2 may be directly arranged on the auxiliary function region 1 without arranging the hollowed-out position on the auxiliary function region 1.

Furthermore, multiple connecting portions are arranged at an edge of each core function region 2. Each connecting portion is electrically connected to the wiring in the auxiliary function region 1. The connecting portion is arranged at the edge of the core function region 2 to connect to the wiring in the auxiliary function region 1 more desirably, thereby ensuring connection reliability. In a preferred embodiment, the connecting portion is a connecting half-hole.

For the specific connection, the wiring includes at least one cascade circuit and multiple battery circuits. A first end of each battery circuit is electrically connected to the corresponding connecting portion. A second end of each battery circuit is electrically connected to the battery. Two ends of the at least one cascade circuit are respectively electrically connected to corresponding connecting portions on two adjacent core function regions 2. For a specific manner in which the second end of each battery circuit is electrically connected to the battery, reference may be made to the foregoing description.

FIG. 4 is an exemplary schematic diagram in which two core function regions 2 and an auxiliary function region 1 are independently arranged according to an embodiment of the present disclosure. In FIG. 4, each core function region 2 does not use the FPC board as a carrier board, but uses the PCB as a carrier board. In addition, since the auxiliary function region 1 adopts the FPC board, cascading between the core function regions 2 is still realized by the flexible circuit. The terminal connector 4 is connected to the battery by using the lead-out portion of the FPC board. In this arrangement, the terminal connector 4 is substantially included in the auxiliary function region 1. However, since each core function region 2 adopts the PCB, the multiple core function regions 2 cannot be integrally formed with the auxiliary function region 1 and the terminal connector 4, and can only be separately arranged. However, the existing conventional connection manner of nickel piece soldering is replaced for the battery end. The two arrangements simplify a manufacturing process of the auxiliary function region 2, greatly reduce costs for the nickel piece, and resolve a problem regarding a position and a flatness of the nickel piece.

Based on the above, in the present disclosure, the multiple core function regions are directly cascaded with each other by using the wiring of the auxiliary function region. The auxiliary function region replaces the traditional wire harness, which replaces the current solution of realizing cascading by using a wire harness and a connector. Therefore, problems that an impedance of the sampling device increases and a probability of failure increases caused by a large number of wire harness connection links do not exist. In addition, integration efficiency of the core function region is improved, an area of a main carrier board in the region with high costs is reduced, and costs are reduced. The core function region may be standardized to reduce development costs and cycles.

Moreover, the risks caused by poor soldering between the connector and the PCB, breakage of the wire harness, and the like are avoided. In addition, since the connector does not exist, the physical area of the PCB can be reduced, which indirectly reduces the costs and the volume of the collection device. The auxiliary function region may be expanded as needed to form multiple core function regions connected to each other, to reduce connection wire harnesses and inserts between conventional PCBs, thereby simplifying a design, reducing costs, and improving reliability.

In addition, a process of manually inserting and connecting a communication wire harness is canceled. The auxiliary function region cascades the core function region. One mounting corresponds to multiple battery sampling devices, so that collection devices do not need to be mounted one by one, thereby reducing a mounting time, realizing efficient mounting, facilitating mounting, and avoiding a risk of erroneously inserting a wire harness. If the auxiliary function region adopts the FPC board, the manufacturing process of the auxiliary function region is further simplified, costs for the nickel piece are greatly reduced, and the problem regarding the position and the flatness of the nickel piece is resolved. In addition, the terminal connector may be implemented in multiple manners, which is compatible with multiple battery system designs.

To more clearly explain and describe the sampling device of the present disclosure, a description is provided below by using an example in which the auxiliary function region adopts the FPC board, the core function region adopts the PCB, and the terminal connector adopts the nickel piece.

FIG. 5 is a partial schematic structural diagram of a sampling device in which an auxiliary function region adopts, for example, an FPC board and a core function region adopts, for example, a PCB according to an embodiment of the present disclosure. An FPC board 1 is connected to the battery 3. Two PCBs 2 are arranged on the FPC board 1. The two PCBs 2 are cascaded by using a flexible circuit 100 of the FPC board 1.

It should be noted that, in an actual sampling device, one FPC board 1 may be used, and multiple PCBs 2 are arranged thereon. A quantity of the PCBs 2 is determined based on a quantity of batteries in a battery module.

Based on an arrangement requirement of the PCBs, the FPC board 1 needs to be hollowed out. Therefore, a position on the FPC board 1 corresponding to an arrangement position of each PCB 2 is hollowed out. The FPC board 1 is connected to the multiple PCBs 2 through soldering.

Specifically, a circuit of the FPC board 1 includes multiple circuits. An edge of each PCB 2 is provided with multiple half-holes. The multiple half-holes include connecting half-holes. The PCBs 2 are soldered to corresponding circuits through respective connecting half-holes. Each connecting half-hole corresponds to a circuit.

The multiple circuits include at least one cascade circuit and multiple battery circuits. A first end of each battery circuit is soldered to the corresponding connecting half-hole. A second end of each battery circuit is soldered to the battery 3. A specific method for soldering to the battery is as follows: The second end of each battery circuit has a nickel piece 4 (shown in FIG. 5) soldered thereto. The second end of each battery circuit is soldered to the battery 3 through the nickel piece 4.

Two ends of the at least one cascade circuit are respectively soldered to the corresponding connecting half-holes on the two cascaded PCBs 2. For example, a circuit 100 in FIG. 5 is a cascade circuit. Two ends of the circuit 100 are respectively soldered to the corresponding connecting half-holes on the two cascaded PCBs 2. Certainly, according to an actual requirement, during cascading of the PCB, one cascade circuit may be required, or multiple cascade circuits may be required. A quantity of cascade circuits needs to be determined according to an actual requirement.

FIG. 6 is a schematic diagram of connection between a single PCB 2 and an FPC board 1 according to an embodiment of the present disclosure. Similarly, although only a connection relationship between key devices is shown in FIG. 2, it does not mean that the sampling device consists of only the devices.

In FIG. 6, multiple half-holes 2011 are provided on an edge of the PCB 2. To solder each half-hole 2011 to a corresponding circuit, a pad 2012 usually needs to be arranged on the corresponding circuit. After the two are soldered together by using solder, a half-hole solder joint 201 is formed. The half-hole solder joint 201 realizes sampling of parameters of the battery 3 by the PCB 2 through a circuit 200 (it is assumed that the circuit 200 is a battery circuit). Alternatively, the half-hole solder joint 201 realizes the cascading of the PCB 2 to another PCB 2 through the circuit 200 (it is assumed that the circuit 200 is a cascade circuit). In addition, the multiple half-holes on the PCB 2 further include a spare half-hole. The spare half-hole may be soldered to a corresponding circuit. Alternatively, the spare half-hole is not connected to the corresponding circuit. In other words, the spare half-hole is reserved for expanding functions of the PCB 2 in the future, and may be soldered to the corresponding circuit first for standby application. Alternatively, the spare half-hole may not be connected to the corresponding circuit, and may be soldered when needed.

For the connection between the nickel piece 4 and the battery, comprehensive reference may be made to FIG. 5 and FIG. 7. FIG. 7 is a schematic structural diagram of a battery and a pole structure thereof according to an embodiment of the present disclosure. FIG. 7 exemplarily shows four batteries 3. A pole 5 and a pole 6 exist on each battery 3. The poles 6 of each two batteries 3 are connected through a copper bar 7.

During soldering of the nickel piece 4 shown in FIG. 5 and FIG. 7 to the battery 3, for each battery, the pole 5 needs to be separately soldered to the nickel piece 4. Since the pole 6 is connected to the pole 6 of another battery through the copper bar 7, only the copper bar 7 needs to be soldered to the nickel piece 4, without a need to solder one nickel piece 4 to each pole 6, which reduces a quantity of nickel piece 4 and corresponding circuits, thereby indirectly reducing soldering complexity and a soldering quantity. The connection manner between the nickel piece 4 and the battery may be further embodied through FIG. 5. An upper row of nickel pieces are separately soldered to the poles 5 of the batteries, and a lower row of nickel pieces are soldered to the copper bars 7, which do not need to be separately soldered to the poles 6 of the batteries. It should be noted that, the nickel pieces 4 are soldered to the battery 3 with a housing of a core of the battery being charged. If the housing of the core of the battery is not charged, one of the pole 5 and the pole 6 of each battery needs to be soldered to the nickel piece 4.

To describe the sampling device more clearly, FIG. 8 is an exploded view of a sampling device formed by two PCBs and an FPC board according to an embodiment of the present disclosure. FIG. 8 clearly shows that a corresponding position on the FPC board 1 for arranging the PCB 2 is hollowed out, and multiple half-holes 2011 are provided on an edge of the PCB 2. FIG. 8 exemplarily shows multiple battery circuits 300 and multiple cascade circuits 400.

To protect the FPC board 1, an upper surface and a lower surface of the FPC board 1 each need to be covered with a layer of film, that is, are respectively covered with an upper cover film 8 and a lower cover film 9. The upper cover film 8 has openings corresponding to the solder joints of the connecting half-holes. The lower cover film 9 has openings corresponding to solder joints between the nickel pieces 4 and the battery 3 has an opening. In addition, because solder points are relatively dense, a specific flatness needs to be ensured. To ensure that a position for soldering the PCB is relatively flat, a reinforcing sheet 10 is further required. In this way, the multiple PCBs 2 can be cascaded, and the multiple PCBs 2 can sample the parameters of the battery 3 through the FPC board 1.

The foregoing sampling device using the FPC board as a substrate is mainly applied to vehicles that use electric energy as an energy source (including pure electric vehicles and hybrid vehicles). For sampling of battery parameters of these vehicles, due to a limited battery mounting space, a minimized space ratio is required while a sampling function and sampling accuracy are ensured. The sampling device using the FPC board as the auxiliary function region effectively resolves the requirement. The sampling device using the FPC board as the auxiliary function region and the FPC board as the carrier board of the core function region is an optimal solution. In addition, the proposed sampling device can be further applied to other similar devices or products with a relatively small space, which has wide applicability.

Moreover, when no space ratio requirement is imposed on the sampling device proposed in the present disclosure, to further reduce costs, a hard plate may be used as a substrate to form the sampling device. In other words, the PCB is used as the substrate to form the sampling device. For example, on devices having a large battery mounting space, a large PCB may be used as the substrate, and multiple small PCBs are arranged on the large PCB. Connection manners of rest devices are the same as those in the foregoing sampling device that uses the FPC board as the substrate. Details are not described herein. After the PCB is used as the substrate, only green oil or blue oil needs to be applied to an upper surface and a lower surface of the PCB, which has lower costs than the solution of covering the upper surface and the lower surface of the FPC board with the cover films, thereby reducing costs of the sampling device.

Based on the foregoing sampling device, an embodiment of the present disclosure further provides a battery management system. The battery management system includes a battery management controller and any of the foregoing sampling device. A connecting insert is arranged on the sampling device. The sampling device is electrically connected to the battery management controller through the connecting insert. FIG. 9 is a schematic structural diagram of a battery management system according to an embodiment of the present disclosure.

In the multiple cascaded core function regions (that is, CFA1 to CFAN) of the sampling device, a first core function region (that is, CFA1) and a last core function region (that is, CFAN) each have a wire harness connector 11 arranged thereon. The wire harness connector 11 is configured for insertion and connection of a wire harness 15. The first core function region and the last core function region are connected to the battery management controller 12 through respective wire harness connectors 11 and wire harnesses 15. Generally, the battery management controller 12 is located inside a power distribution box 13.

The battery management controller 12 is connected to a vehicle controller 14. The battery management controller 12 is configured to receive and process a signal transmitted by the sampling device, and transmit the processed signal to the vehicle controller 14. The vehicle controller 14 may perform further processing based on the received signal.

Based on the foregoing sampling device, an embodiment of the present disclosure further provides a battery pack. The battery pack includes any of the foregoing sampling devices.

Based on the foregoing sampling device, an embodiment of the present disclosure further provides a vehicle. The vehicle includes any of the foregoing sampling devices.

Through the foregoing embodiments, in the sampling device of the present disclosure, the auxiliary function region replaces the traditional wire harness, which replaces the current solution of realizing cascading by using a wire harness and a connector. Therefore, problems that an impedance of the sampling device increases and a probability of failure increases caused by a large number of wire harness connection links do not exist. In addition, integration efficiency of the core function region is improved, an area of a main carrier board in the region with high costs is reduced, and costs are reduced. The core function region may be standardized to reduce development costs and cycles.

Moreover, the risks caused by poor soldering between the connector and the PCB, breakage of the wire harness, and the like are avoided. In addition, since the connector does not exist, the physical area of the PCB can be reduced, which indirectly reduces the costs and the volume of the collection device. The auxiliary function region may be expanded as needed to form multiple core function regions connected to each other, to reduce connection wire harnesses and inserts between conventional PCBs, thereby simplifying a design, reducing costs, and improving reliability.

In addition, a process of manually inserting and connecting a communication wire harness is canceled. The auxiliary function region cascades the core function region. One mounting corresponds to multiple battery sampling devices, so that collection devices do not need to be mounted one by one, thereby reducing a mounting time, realizing efficient mounting, facilitating mounting, and avoiding a risk of erroneously inserting a wire harness. If the auxiliary function region 2 adopts the FPC board, a manufacturing process of the auxiliary function region 2 is further simplified, costs for the nickel piece are greatly reduced, and a problem regarding a position and a flatness of the nickel piece is resolved. In addition, the terminal connector may be implemented in multiple manners, which is compatible with multiple battery system designs, and has high practicability.

Although preferred embodiments of the embodiments of the present disclosure have been described, persons skilled in the art may make other changes and modifications to these embodiments once they know the basic creative concept. Therefore, the appended claims are intended to be interpreted as including the preferred embodiments and changes and modifications falling within the scope of the embodiments of the present disclosure.

Finally, it should be noted that, the relational terms herein such as first and second are merely used for differentiating an entity or operation from another entity or operation, and do not require or imply any actual relationship or sequence between these entities or operations. Further, the terms "comprise", "include", or any other variants are intended to encompass non-exclusive inclusion, such that a process, a method, an article, or a terminal device including a series of elements not only include those elements, but also includes other elements not listed explicitly or includes intrinsic elements for the process, the method, the article, or the terminal device. If no more limitations are made, an element limited by "include a/an . . . " does not exclude other same elements existing in the process, the method, the article, or the terminal device including the element.

The technical solutions provided in the embodiments of the present disclosure are described above in detail. Although the principles and implementations of the present disclosure are described by using specific examples in this specification, the descriptions of the foregoing embodiments are merely used for helping understand the method of the present disclosure and the core idea of the method. Meanwhile, a person of ordinary skill in the art may make modifications to the specific implementations and application scope according to the idea of the present disclosure. In conclusion, the content of this specification is not to be construed as a limitation on the present disclosure.

What is claimed is:

1. A sampling device for a battery module having a plurality of batteries, comprising:

a plurality of core function regions, an auxiliary function region, and a plurality of terminal connectors, the plurality of core function regions being configured to process battery information of the plurality of batteries;

the auxiliary function region having wiring arranged therein, and being configured to transmit a signal corresponding to the battery information, and the plurality of core function regions being cascaded together through the wiring of the auxiliary function region; and the terminal connectors being configured to connect the plurality of batteries and the auxiliary function region to collect the battery information, wherein the plurality of core function regions are arranged in the auxiliary function region and are connected to the plurality of batteries through the terminal connectors.

2. The sampling device according to claim 1, wherein the auxiliary function region has a plurality of lead-out terminals; the terminal connectors are electrically connected to the lead-out terminals of the auxiliary function region; or the lead-out terminals of the auxiliary function region are the terminal connectors.

3. The sampling device according to claim 2, wherein the terminal connectors are made of a metal material, wherein the sampling device is of an elongated shape, and the terminal connectors are arranged on both sides of the elongated shape.

4. The sampling device according to claim 1, wherein the plurality of core function regions and the auxiliary function region are integrally arranged; and the plurality of core function regions are integrated in the auxiliary function region.

5. The sampling device according to claim 4, wherein the core function regions and the auxiliary function region are flexible printed circuit (FPC) boards or printed circuit boards (PCBs).

6. The sampling device according to claim 1, wherein the plurality of core function regions and the auxiliary function region are independently arranged; and the plurality of core function regions are arranged on the auxiliary function region.

7. The sampling device according to claim 6, wherein the core function regions are FPC boards; and the auxiliary function region is a PCB; or the core function regions are PCBs; and the auxiliary function region is an FPC board.

8. The sampling device according to claim 6, wherein a position on the auxiliary function region corresponding to each core function region is hollowed out; and the core function region is arranged at the hollowed-out position and is electrically connected to the auxiliary function region.

9. The sampling device according to claim 8, wherein an area of the hollowed-out position is less than an area of each core function region.

10. The sampling device according to claim 6, wherein a plurality of connecting portions are arranged at an edge of each core function region; and each connecting portion is electrically connected to the wiring in the auxiliary function region.

11. The sampling device according to claim 10, wherein the wiring comprises at least one cascade circuit and a plurality of battery circuits;

a first end of each battery circuit is electrically connected to the corresponding connecting portion; and a second end of each battery circuit is electrically connected to one of the plurality of batteries; and two ends of the at least one cascade circuit are respectively electrically connected to corresponding connecting portions on two adjacent core function regions.

12. The sampling device according to claim 10, wherein the connecting portion is a connecting half-hole.

13. The sampling device according to claim 11, wherein the second end of each battery circuit has a nickel piece soldered thereto; and the second end of each battery circuit is soldered to the battery through the nickel piece.

14. A battery management system, comprising a battery management controller and the sampling device according to claim 1, a connecting insert being arranged on the sampling device, and the sampling device being electrically connected to the battery management controller through the connecting insert.

15. The battery management system according to claim 14, wherein the connecting insert comprises a wire harness connector; in the plurality of cascaded core function regions, a first core function region and a last core function region each have the wire harness connector arranged thereon; the wire harness connector is configured for insertion and connection of a wire harness; and the first core function region and the last core function region are connected to the battery management controller through respective wire harness connectors and wire harnesses.

16. The battery management system according to claim 14, wherein the battery management controller is connected to a vehicle controller; and the battery management controller is configured to receive and process a signal transmitted by the sampling device, and transmit the processed signal to the vehicle controller.

17. A vehicle, comprising the sampling device according to claim 1.

* * * * *